(12) United States Patent
Brodsky et al.

(10) Patent No.: US 6,679,707 B1
(45) Date of Patent: Jan. 20, 2004

(54) LAND GRID ARRAY CONNECTOR AND METHOD FOR FORMING THE SAME

(75) Inventors: William L. Brodsky, Binghamton, NY (US); William E. Buchler, Jr., Owego, NY (US); Benson Chan, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/254,239

(22) Filed: Sep. 25, 2002

(51) Int. Cl.[7] .................................................. H05K 1/00
(52) U.S. Cl. .............................. 439/71; 439/70; 439/72; 439/66; 339/17 CF; 361/400; 361/760; 361/818
(58) Field of Search .............................. 439/71, 70, 72, 439/66; 339/17 CF; 361/400, 760, 818

(56) References Cited

U.S. PATENT DOCUMENTS

| | | | |
|---|---|---|---|
| 3,042,895 A | 7/1962 | Bonhomme | 339/176 |
| 4,269,470 A | 5/1981 | Ustin | 339/198 H |
| 4,341,429 A * | 7/1982 | Bright et al. | 439/268 |
| 4,425,018 A | 1/1984 | Stenz | 339/198 GA |
| 4,469,393 A | 9/1984 | Chewning, Jr. et al. | 339/198 GA |
| 4,552,422 A * | 11/1985 | Bennett et al. | 439/69 |
| 5,443,404 A * | 8/1995 | Matsuoka | 439/717 |
| 5,951,306 A * | 9/1999 | Millhimes | 439/79 |
| 6,193,550 B1 | 2/2001 | Yamashita et al. | 439/594 |
| 6,264,501 B1 * | 7/2001 | Hung et al. | 439/541.5 |

* cited by examiner

*Primary Examiner*—Anthony Dinkins
*Assistant Examiner*—Anton Harris
(74) *Attorney, Agent, or Firm*—Ronald A. D'Alessandro; Hoffman, Warnick & D'Alessandro LLC

(57) ABSTRACT

The present invention provides a land grid array (LGA) connector that is formed from a plurality of sections. Specifically, each LGA section includes at least one set of fingers. Each set of fingers interconnects with a set of fingers of another section to form the LGA connector. By forming the LGA connector in this manner a maximum quantity of input/output (I/O) contacts can be provided.

23 Claims, 3 Drawing Sheets

LAND GRID ARRAY CONNECTOR AND METHOD FOR FORMING THE SAME

BACKGROUND OF THE INVENTION

1. Field of the Invention

In general, the present invention relates to a land grid array (LGA) connector and method for forming the same. Specifically, the present invention provides a plurality of LGA connector sections that each include interconnecting fingers for joining the sections together.

2. Background Art

Land grid array (LGA) packages are becoming one of the most popular packages in the interconnect market. Specifically, as input/output (I/O) requirements and the use of the flip chip have increased, ball grid array (BGA) and column grid array (CGA) packages have become less compatible for assembly (distance from neutral point, etc.), and LGA packages have become a necessity. One environment in which LGA packages are highly suitable is the mobile device (e.g., cellular, wireless, etc.) market. However, with this increased popularity of LGA packages, a new set of attachment requirements have emerged. That is, the surface of the printed wiring board (PWB) must allow for attachment of an LGA package for which solderable connections or other interconnects may not be suitable.

Heretofore, various LGA connectors have been developed for interconnecting LGA packages and PWBs. In general, when the LGA connector is formed, I/O contacts are positioned in a column-row configuration about the top surface of the connector. The goal is to obtain the highest quantity of contacts on the LGA connector. Unfortunately, previous attempts in forming the LGA connector were met with difficulties resulting from material flow and shrinkages, problems that were magnified as the array became larger. To address some of these problems, one previous attempt formed a LGA connector from multiple smaller sections that were joined together with separating ribs. Unfortunately, because the separating ribs consumed a significant amount of space on the connector, a substantial depopulated area was provided. For example, it is common for the separating ribs depopulate as much as seven rows of the connector, which results in a yield of only approximately 5184 contacts (i.e., for an overall contact array of 87×87 (7569) on a 1 mm pitch).

In view of the foregoing, there exists a need for a LGA connector and method for forming the same that maximizes the quantity of I/O contacts. A further need exists for a LGA connector that is formed from several smaller sections, without the need for separating ribs. Still yet, a need exists for the sections of the LGA connector to include interconnecting fingers for joining the sections together.

SUMMARY OF THE INVENTION

In general, the present invention provides a land grid array (LGA) connector and method for forming the same. Specifically, under the present invention, the LGA connector is formed from multiple (e.g., four) individual sections. Each section typically has at least one set (e.g., two sets) of fingers positioned along outer edges thereof. Each set of fingers of a particular section interconnects with a set of fingers of a different, adjacent section to form the LGA connector.

According to a first aspect of the present invention, a land grid array (LGA) connector is provided. The LGA connector comprises a plurality of sections, wherein each of the plurality of sections includes at least one set of fingers that is adapted to interconnect with a set of fingers of another one of the plurality of sections to form a unitary structure.

According to a second aspect of the present invention, a land grid array (LGA) connector is provided. The LGA connector comprises: (1) a first section having a first set of fingers; (2) a second section having a second set of fingers; and (3) wherein the first set of fingers interconnects with the second set of fingers to form a unitary structure.

According to a third aspect of the present invention, an electronic device is provided. The electronic device comprises: (1) a chip package; (2) a circuit board; and (3) a LGA connector for interconnecting the chip package and the circuit board, wherein the LGA connector comprises a plurality of sections, and wherein each of the plurality of sections includes at least one set of fingers that is adapted to interconnect with a set of fingers of another one of the plurality of sections to form a unitary structure.

According to a fourth aspect of the present invention, a land grid array (LGA) connector section is provided. The LGA connector section comprises a plurality of outer edges, wherein at least one of the outer edges includes a set of fingers that is adapted to interconnect with another set of fingers of another LGA connector section.

According to a fifth aspect of the present invention, a method for forming a land grid array (LGA) connector is provided. The method comprises: (1) providing a plurality of LGA connector sections, wherein each LGA connector section includes at least one set of fingers; and (2) interconnecting the at least one set of fingers of the plurality of LGA connector sections to form the LGA connector, wherein each of the at least one set of fingers of a particular LGA connector section interconnects with a set of fingers of a different adjacent LGA connector section.

Therefore, the present invention provides a LGA connector and method for forming the same.

BRIEF DESCRIPTION OF THE DRAWINGS

These and other features of this invention will be more readily understood from the following detailed description of the various aspects of the invention taken in conjunction with the accompanying drawings in which.

Figure 1:
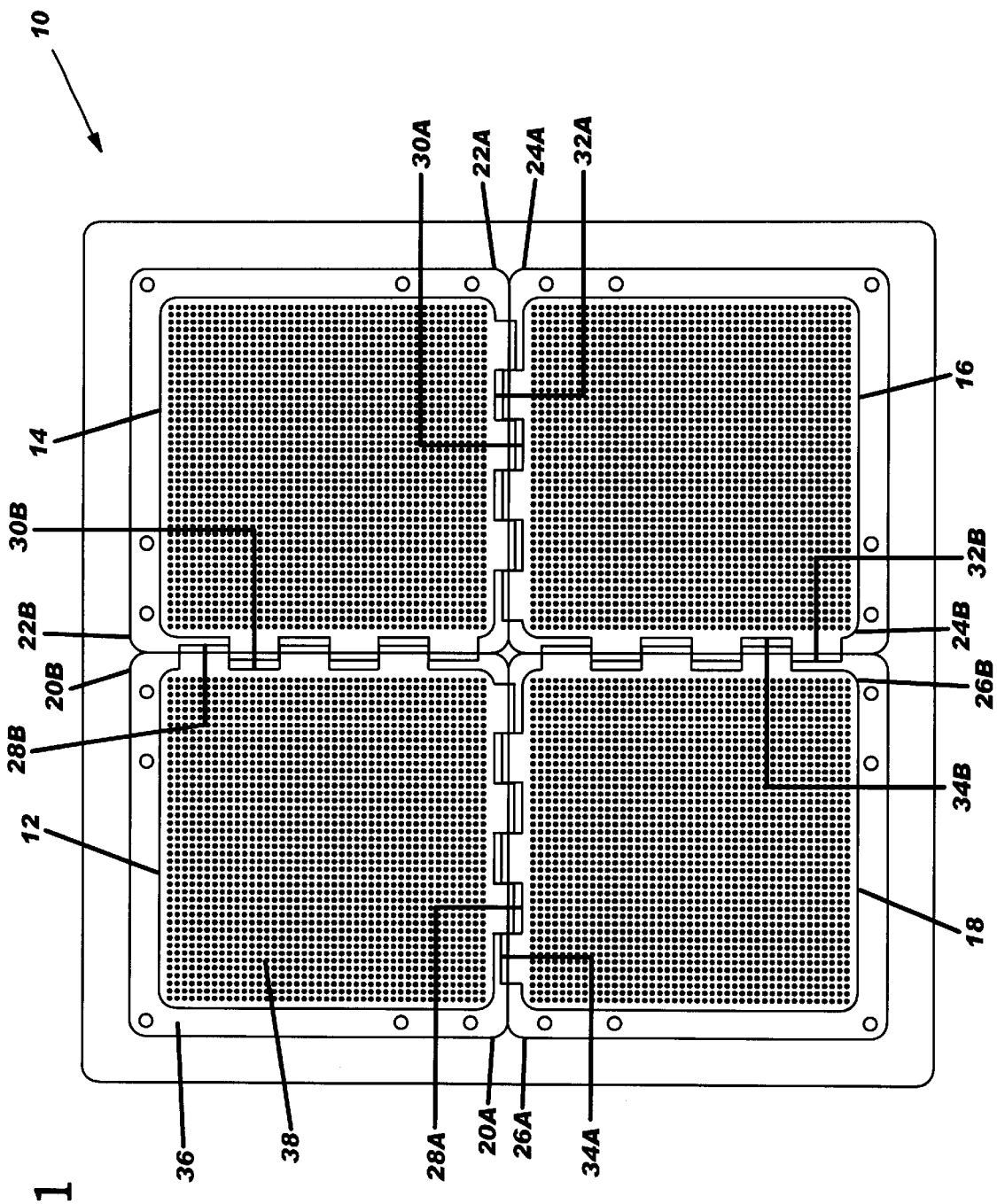
FIG. 1 depicts a LGA connector, according to the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, the present invention provides a land grid array .(LGA) connector and method for forming the same. Specifically, under the present invention, the LGA connector is formed from multiple (e.g., four) individual sections. Each section typically has at least one set (e.g., two sets) of fingers positioned along outer edges thereof. Each set of fingers of a particular section interconnects with a set of fingers from a different, adjacent section to form the LGA connector. By forming the LGA connector in this manner a maximum quantity of input/output (I/O) contacts can be provided. Moreover, each of the sections can be formed from a common mold and then rotated to interconnect with each other.

Referring now to FIG. 1, an exemplary LGA connector 10 according to the present invention is shown. As depicted, LGA connector 10 includes LGA sections 12, 14, 16 and 18. Each LGA section is typically formed from liquid crystal polymer (LCP) and includes two (outer) edges that each have a set of fingers. Specifically, LGA section 12 has edges 20A–B with sets of fingers 28A–B, respectively; LGA section 14 has edges 22A–B with sets of fingers 30A–B, respectively; LGA section 16 has edges 24A–B with sets of fingers 32A–B, respectively; and LGA section 18 has edges 26A–B with sets of fingers 34A–B, respectively. As shown in FIG. 1, each set of fingers interconnects (e.g., frictionally engages) with a set of fingers of another, adjacent section, thereby joining sections 12, 14, 16 and 18 to form LGA connector 10 as a unitary article. As further shown, no two sets of fingers (e.g., 28A–B) on the same LGA section (e.g., 12) joins with fingers of the same section. For example, set of fingers 28A interconnects with set of fingers 34A of LGA section 18, while set of fingers 28B interconnects with set of fingers 30B of LGA section 14. Thus, each set of fingers on a particular LGA section interconnects with a different, adjacent LGA section.

In a typical embodiment, LGA connector 10 includes four sections that each have two sets of fingers (as shown) for a total of eight sets of fingers positioned over eight edges. However, it should be understood that the teachings of the present invention could be implemented with any quantity of LGA sections and sets of fingers. For example, the teachings of present invention could be utilized to form a LGA connector from two LGA sections that each include one set of fingers. In addition, the sets of fingers are typically square shaped to provide optimal interconnection. To this extent, the sets of fingers could be tapered to allow for easy insertion and removal thereof. However, it should be understood that the sets of fingers could be formed in any shape suitable for interconnection.

Also shown in FIG. 1 are I/O contacts 38. In a typical embodiment, I/O contacts are positioned in a column-row arrangement on top surface 36 of LGA connector 10 (i.e., of each LGA section 12, 14, 16 and 18). I/O contacts 38 can be positioned on top surface 36 either before or after interconnection of sets of fingers 28A–B, 30A–B, 32A–B and 34A–B. When LGA connector 10 is formed as described herein, a maximum quantity of I/O contacts can be included. That is, the amount of depopulated space is minimized. Thus, for a 93 mm module (package), LGA connector 10 having four sections 12, 14, 16 and 18 (as shown) can accommodate approximately 7396 (43×43×4) I/O contacts (out of a possible 7569 I/O contacts on a 1 mm pitch). Under previous embodiments utilizing "ribs" to separate the sections, only approximately 5184 (36×36×4) I/O contacts were possible.

Figure 2:
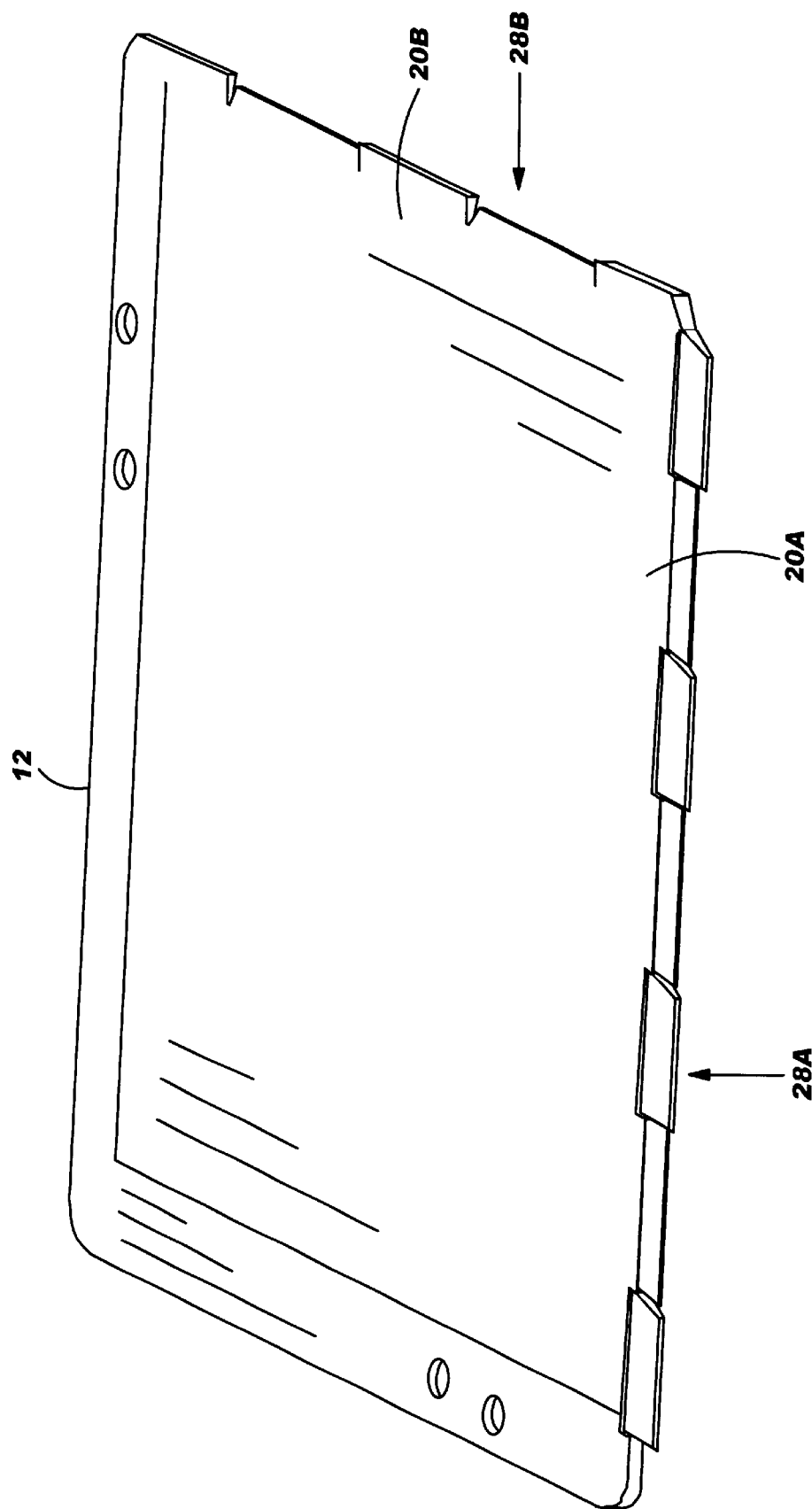
FIG. 2 depicts a LGA connector section of the LGA connector of FIG. 1.

Referring now to FIG. 2, a more detailed depiction of LGA section 12 is shown. As depicted, section 12 includes edges 20A–B that include sets of fingers 28A–B. Under the present invention each set of fingers typically includes two, three or four fingers. However, it should be appreciated that each set of fingers 20A–B could include any quantity of at least one finger. In addition, LGA sections 12, 14, 16 and 18 are typically formed (i.e., molded) from a common mold. Accordingly, each LGA section 12, 14, 16 and 18 can be identical. This allows interconnection of LGA sections 12, 14, 16 and 18 to be accomplished merely by rotating each LGA section 12, 14, 16 and 18 so that the sets of fingers can be interconnected. In addition, set of fingers 28A is typically formed to be complimentary to set of fingers 28B. This allows, for example, for set of fingers 28A of LGA section 12 to interconnect with set of fingers 34A of LGA section 18 in a male-female fashion. That is, set of fingers 28A will fit within the spaces between set of fingers 34A and vice versa.

Figure 3:
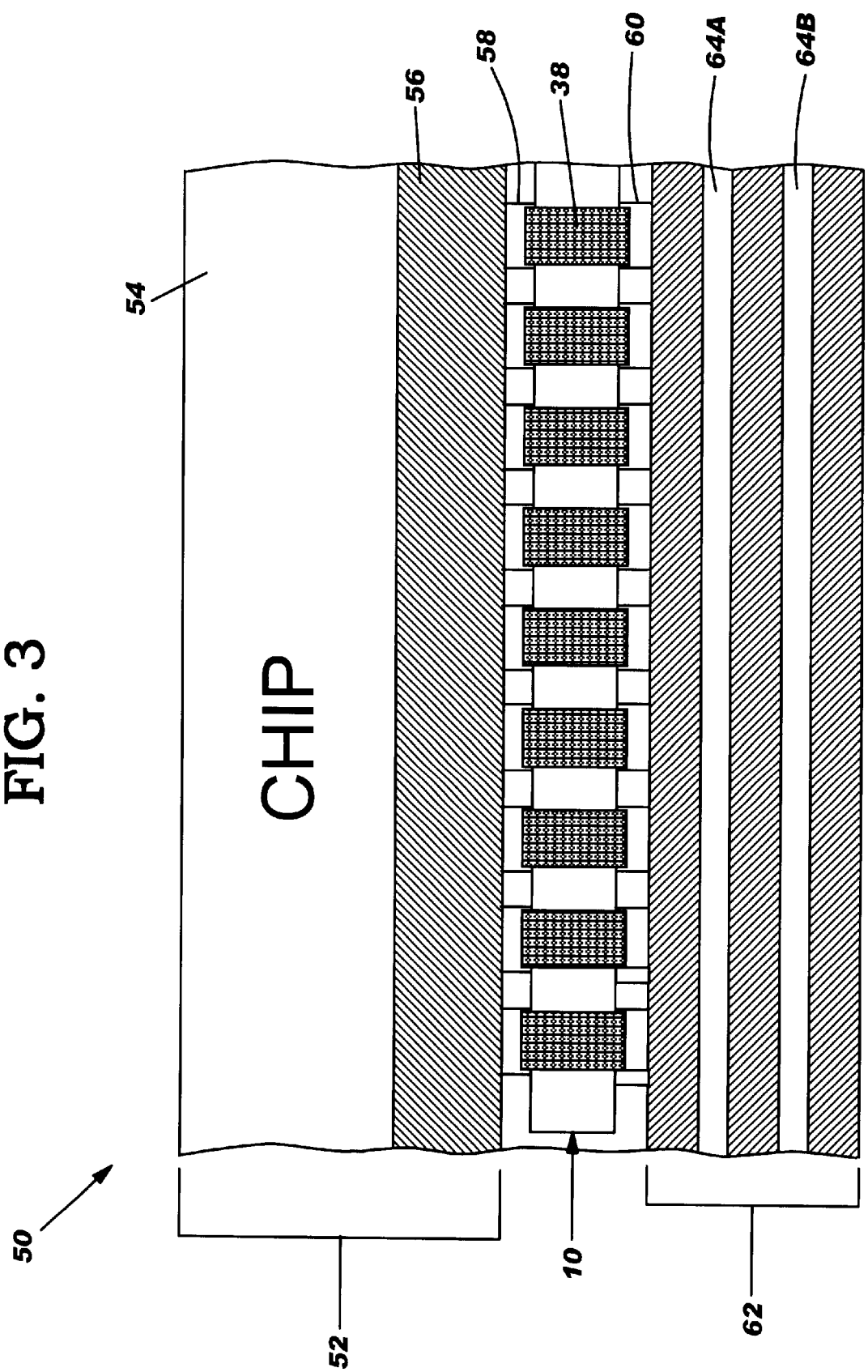
FIG. 3 depicts a cross-sectional view of the LGA connector of FIG. 1, as used to attach a chip package to a circuit board.

Referring now to FIG. 3, a cross-sectional view of LGA connector 10 attaching package or module 52 to circuit board 62 is shown. As depicted, package 52 generally includes at least one chip such as chip 54 and substrate 56. Circuit board 62, as known in the art, generally includes multiple layers such as signal planes 64A–B. As indicated above, the growing popularity of LGA packages (e.g., such as package 52) has given rise to various attachment concerns, which LGA connector 10 addresses. As shown, I/O contacts 38 of LGA connector 10 contact substrate pads 58 and board pads 60. Moreover, because LGA connector 10 is formed by joining multiple LGA sections via sets of interlocking fingers, the quantity of I/O contacts is maximized and the amount of depopulated area is minimized. Thus, improved performance is provided.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A land grid array (LGA) connector comprising a plurality of sections, wherein each of the plurality of sections includes a plurality of edges that each have a set of fingers that is adapted to interconnect with a set of fingers of another one of the plurality of sections to form a unitary structure, wherein each of the sets of fingers comprises a plurality of fingers.

2. The LGA connector of claim 1, wherein each of the sets of fingers are disposed along outer edges of the plurality of sections and are tapered to overlap a surface of another one of the plurality of sections.

3. The LGA connector of claim 1, wherein each of the plurality of sections comprises two sets of fingers, and wherein the two sets of fingers of a particular one of the plurality of sections interconnects with a set of fingers of a different adjacent one of the plurality of sections.

4. The LGA connector of claim 1, wherein the LGA connector comprises four sections, and wherein each of the four sections directly interconnects with two other sections.

5. The LGA connector of claim 1, further comprising a plurality of contacts disposed on a top surface of the LGA connector.

6. The LGA connector of claim 5, wherein the plurality of contacts comprises at least approximately 7396 contacts.

7. The LGA connector of claim 5, wherein the contacts are input/output (I/O) contacts.

8. The LGA connector of claim 1, further comprising a LGA package and a circuit board, wherein the LGA connector interconnects the LGA package and the circuit board.

9. A land grid array (LGA) connector, comprising:
   a first section having a first plurality of fingers;
   a second section having a second plurality of fingers; and
   wherein the first plurality of fingers interconnects with the second plurality of fingers to form a unitary structure.

10. The LGA connector of claim 9, wherein further the first section further comprises a third plurality of fingers, and wherein the third plurality of fingers interconnects with a fourth plurality of fingers of a third section.

11. The LGA connector of claim 10, wherein the second section further comprises a fifth se plurality of fingers, and wherein the fifth plurality of fingers interconnect with a sixth plurality of fingers of a fourth section.

12. The LGA connector of claim 11, wherein the third section further comprises a seventh plurality of fingers, and wherein the seventh plurality of fingers interconnect with an eighth plurality of fingers of the fourth section.

13. The LGA connector of claim 9, wherein the first plurality of fingers is disposed along an outer edge of the first section, and wherein the second plurality of fingers is disposed along an outer edge of the second section.

14. The LGA connector of claim 9, further comprising a plurality of contacts disposed on a top surface of the LGA connector.

15. The LGA connector of claim 14, wherein the plurality of contacts comprises at least approximately 7396 contacts.

16. The LGA connector of claim 14, wherein the contacts are input/output (I/O) contacts.

17. An electronic device, comprising:
   a chip package;
   a circuit board; and
   a LGA connector for interconnecting the chip package and the circuit board, wherein the LGA connector comprises a plurality of sections, and wherein each of the plurality of sections includes a plurality of edges that each have a set of fingers that interconnects with a set of fingers of another one of the plurality of sections to form a unitary structure, wherein each of the sets of fingers comprises a plurality of tapered fingers that interconnects with a plurality of tapered fingers of another one of the plurality of sections.

18. The electronic device of claim 17, wherein each of the sets of fingers of a particular one of the plurality of sections interconnects with a set of fingers of a different adjacent one of the plurality of sections.

19. The electronic device of claim 17, wherein the LGA connector comprises four sections that each include two sets of fingers.

20. The electronic device of claim 17, further comprising a plurality of contacts disposed on a top surface of the LGA connector.

21. A land grid array (LGA) connector section comprising a plurality of outer edges, wherein at least two of the outer edges includes a set of fingers that is adapted to interconnect with another set of fingers of another LGA connector section and wherein each of the sets of fingers comprises a plurality of tapered fingers.

22. A method for forming a land grid array (LGA) connector comprising:
   providing a plurality of LGA connector sections, wherein each LGA connector section includes a plurality of edges that each have a set of fingers that comprises a plurality of fingers; and
   interconnecting the sets of fingers of the plurality of LGA connector sections to form the LGA connector, wherein each of the sets of fingers of a particular LGA connector section interconnects with a set of fingers of a different adjacent LGA connector section.

23. The method of claim 22, wherein the providing step comprises molding each of the plurality of LGA connector sections from a common mold.

* * * * *